(12) United States Patent
Harley et al.

(10) Patent No.: US 8,232,186 B2
(45) Date of Patent: Jul. 31, 2012

(54) METHODS OF INTEGRATING REVERSE ESIGE ON NFET AND SIGE CHANNEL ON PFET, AND RELATED STRUCTURE

(75) Inventors: Eric C. T. Harley, LaGrangeville, NY (US); Judson R. Holt, Wappingers Falls, NY (US); Dominic J. Schepis, Wappingers Falls, NY (US); Michael D. Steigerwalt, Newburgh, NY (US); Linda Black, Fishkill, NY (US); Rick Carter, Hopewell Junction, NY (US)

(73) Assignees: International Business Machines Corporation, Armonk, NY (US); Globalfoundries, Grand Cayman (KY)

( * ) Notice: Subject to any disclaimer, the term of this patent is extended or adjusted under 35 U.S.C. 154(b) by 580 days.

(21) Appl. No.: 12/128,955

(22) Filed: May 29, 2008

(65) Prior Publication Data

US 2009/0294801 A1 Dec. 3, 2009

(51) Int. Cl.
*H01L 21/20* (2006.01)
(52) U.S. Cl. ............... 438/507; 438/199; 257/E21.633; 257/E27.062
(58) Field of Classification Search ........... 257/E21.633, 257/E27.062; 438/507, 199
See application file for complete search history.

(56) References Cited

U.S. PATENT DOCUMENTS

| 6,369,438 | B1 * | 4/2002 | Sugiyama et al. | 257/616 |
|---|---|---|---|---|
| 6,600,170 | B1 * | 7/2003 | Xiang | 257/18 |
| 7,138,310 | B2 | 11/2006 | Currie et al. | |
| 7,238,989 | B2 | 7/2007 | Yeo et al. | |
| 7,262,087 | B2 | 8/2007 | Chidambarrao et al. | |
| 2004/0126958 | A1 * | 7/2004 | Usuda et al. | 438/217 |
| 2004/0142545 | A1 | 7/2004 | Ngo et al. | |
| 2004/0188760 | A1 * | 9/2004 | Skotnicki et al. | 257/347 |
| 2005/0133819 | A1 * | 6/2005 | Kawasaki | 257/195 |
| 2007/0231999 | A1 * | 10/2007 | Wang et al. | 438/261 |

OTHER PUBLICATIONS

Donaton et al., "Design and Fabrication of MOSFETs with a Reverse Embedded SiGe (Rev. e-SiGe) Structure," IEEE 2006, 4 pages.

\* cited by examiner

*Primary Examiner* — Matthew Reames
(74) *Attorney, Agent, or Firm* — Hoffman Warnick LLC; Ian D. MacKinnon (57) ABSTRACT

Methods of integrating reverse embedded silicon germanium (SiGe) on an NFET and SiGe channel on a PFET, and a related structure are disclosed. One method may include providing a substrate including an NFET area and a PFET area; performing a single epitaxial growth of a silicon germanium (SiGe) layer over the substrate; forming an NFET in the NFET area, the NFET including a SiGe plug in a channel thereof formed from the SiGe layer; and forming a PFET in the PFET area, the PFET including a SiGe channel formed from the SiGe layer. As an option, the SiGe layer over the PFET area may be thinned.

16 Claims, 12 Drawing Sheets

METHODS OF INTEGRATING REVERSE ESIGE ON NFET AND SIGE CHANNEL ON PFET, AND RELATED STRUCTURE

BACKGROUND

1. Technical Field

The disclosure relates generally to integrated circuit (IC) chip fabrication, and more particularly, to a high-k/metal gate transistor fabrication.

2. Background Art

To enable high performance complementary metal-oxide semiconductor (CMOS) technologies such as high dielectric constant (high-k) and metal gate solutions, a band-edge metal is required in the channel for each transistor to maximize performance and provide threshold voltages (Vt) appropriate for low voltage, low power technologies. Different band-edge metals in the channels have been shown to work for n-type field effect transistors (NFETs) and p-type FETs (PFETs). One challenge relative to fabricating these devices is preventing shifts in Vt during processing that occurs after initial formation.

Another challenge is to form both NFETs and PFETs together where each requires a different, or different concentration of, a band-edge metal. Typically, different, non-compatible, fabrication techniques are used. For example, one technique for certain PFETs includes using a thin epitaxially grown silicon germanium (SiGe) layer grown on top of a single crystal silicon layer to generate a SiGe channel for the PFET. The SiGe channel enables a shift of voltage from mid-gap to band-edge for the metal gate of the PFET, which improves performance. In contrast, for certain NFETs, a technique referred to as reverse embedded silicon germanium, i.e., reverse eSiGe, uses a plug of SiGe material embedded underneath the channel region of the device. The plug advantageously tensilely stresses the channel region which improves performance of the NFET. Current approaches to integrate both devices use multiple selective epitaxial growth processes for the different SiGe portions. That is, different selective epitaxial processes are used to grow the SiGe channel for PFETs, the SiGe plug for NFETS and perhaps SiGe source/drain regions. In addition, in some cases, an epitaxially grown silicon cap may be required on the SiGe plug of the NFETs and perhaps on the SiGe channel of the PFETs. The multiple epitaxial processes present a number of disadvantages such as added expense and poor throughput. In addition, each selective epitaxial growth process required presents a challenge regarding removal of any residual oxide that may form on the epitaxially grown area during exposure to the environment. More specifically, each epitaxially grown area may require an aqueous hydro-fluoric acid (HF) pre-clean and an in-situ hydrogen ($H_2$) pre-bake prior to subsequent processing to remove any residual oxide, which may cause defects if not adequately removed. Since the temperature of the in-situ $H_2$ pre-bake must be controlled to prevent damage to any previously formed sections, adequate oxide removal is challenging and oftentimes results in non-uniformity issues. Further non-uniformity and complexity issues are presented by the selective epitaxial growth processes in that the morphology of the sections being formed, and the edge effects of the sections, is defined by the openings into which the epitaxy is performed.

SUMMARY

Methods of integrating reverse embedded silicon germanium (SiGe) on an NFET and SiGe channel on a PFET, and a related structure are disclosed. One method may include providing a substrate including an NFET area and a PFET area; performing a single epitaxial growth of a silicon germanium (SiGe) layer over the substrate; forming an NFET in the NFET area, the NFET including a SiGe plug in a channel thereof formed from the SiGe layer; and forming a PFET in the PFET area, the PFET including a SiGe channel formed from the SiGe layer. As an option, the SiGe layer over the PFET area may be thinned.

A first aspect of the disclosure provides a method comprising: providing a substrate including an NFET area and a PFET area; performing a single epitaxial growth of a silicon germanium (SiGe) layer over the substrate; thinning the SiGe layer over the PFET area; forming an NFET in the NFET area, the NFET including a SiGe plug in a channel thereof formed from the SiGe layer; and forming a PFET in the PFET area, the PFET including a SiGe channel formed from the SiGe layer.

A second aspect of the disclosure provides a method comprising: providing a substrate including an NFET area and a PFET area; performing a single epitaxial growth of a silicon germanium (SiGe) layer over the substrate; forming an NFET in the NFET area, the NFET including a SiGe plug in a channel thereof formed from the SiGe layer; and forming a PFET in the PFET area, the PFET including a SiGe channel formed from the SiGe layer.

A third aspect of the disclosure provides a structure comprising: an NFET having an embedded silicon germanium (SiGe) plug in a channel thereof; a PFET having a SiGe channel; and a trench isolation between the NFET and the PFET, wherein the NFET and the PFET are devoid of SiGe epitaxial growth edge effects.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure relates to methods of forming, and related structure, a single epitaxial growth of a silicon germanium (SiGe) layer on both an n-type field effect transistor (NFET) area and p-type FET (PFET) area, which allows for process simplification. The thickness and composition of the SiGe layer in the PFET area can be separately controlled in an optional thinning process.

Figure 1:
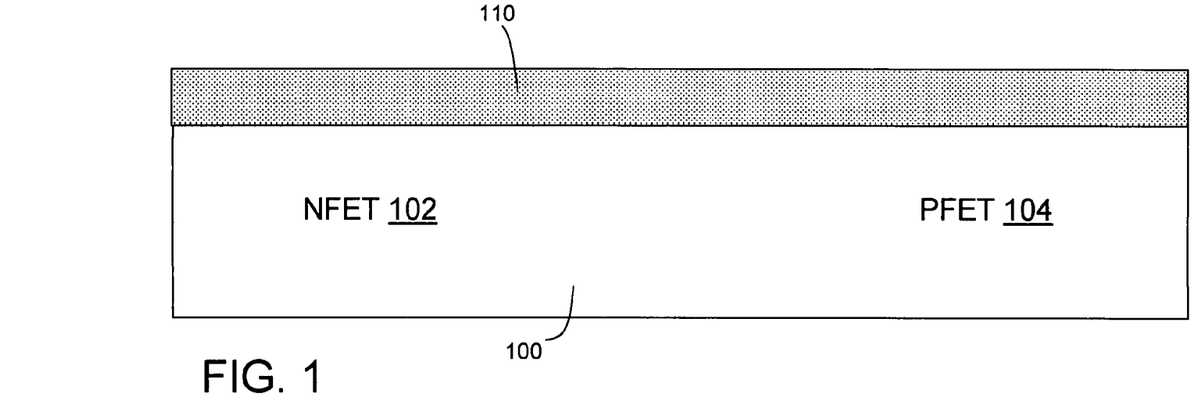
FIG. 1 shows one embodiment of a substrate providing process and epitaxial grown SiGe layer according to the disclosure.

Referring to the drawings, FIG. 1 shows a first process including providing a substrate 100 including an NFET area 102 and a PFET area 102. NFET area 102 and PFET area 104 indicate regions of substrate 100 that will eventually have NFETs and PFETs formed thereon. As understood, the position of areas 102, 104 may be switched. Substrate 100 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Figure 2:
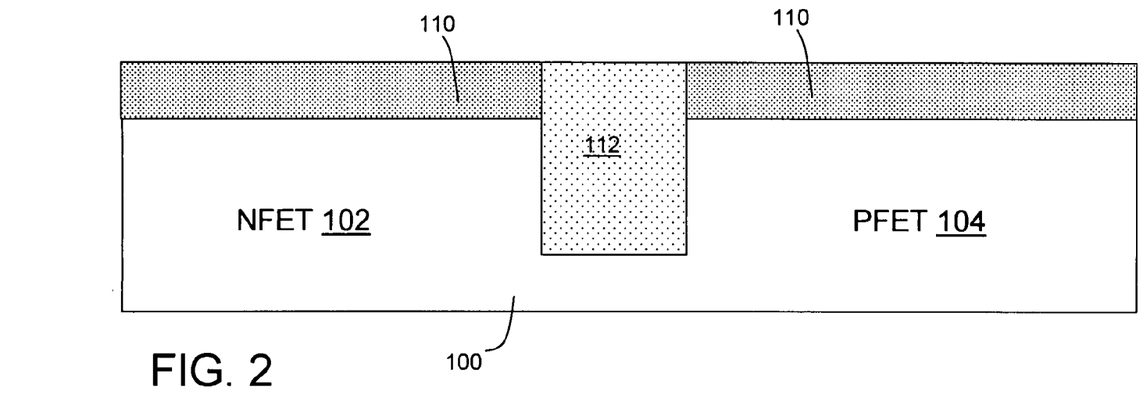
FIGS. 2-7 show other embodiments of the FIG. 1 process according to the disclosure.

FIG. 1 also shows performing a single epitaxial growth of a silicon germanium (SiGe) layer 110 over substrate 100. SiGe layer 110 may include any required concentration ratio of Si to Ge, and may include concentration gradients. Epitaxial growth, as understood in the art, includes an ordered crystalline growth on a monocrystalline material, and may be grown from gaseous or liquid precursors. Since the underlying material acts as a seed material, the grown layer takes on a lattice structure and orientation identical to those of the underlying material. However, the different composition of the epitaxial layer leads to lattice constant mismatch at the interface, and hence both the substrate and the epitaxially grown layer are strained. FIG. 2 shows forming a trench isolation 112, such as a shallow trench isolation (STI), after formation of SiGe layer 110. Trench isolation 112 may be formed in any now known or later developed fashion, e.g., depositing a photoresist, patterning the photoresist, etching to form a trench, depositing a dielectric such as silicon oxide ($SiO_2$), and planarizing.

Figure 3:
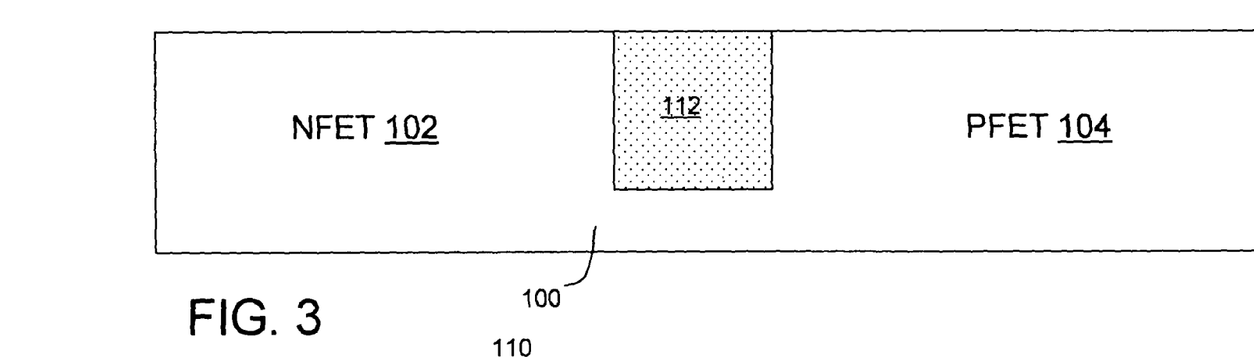
Figure 4:
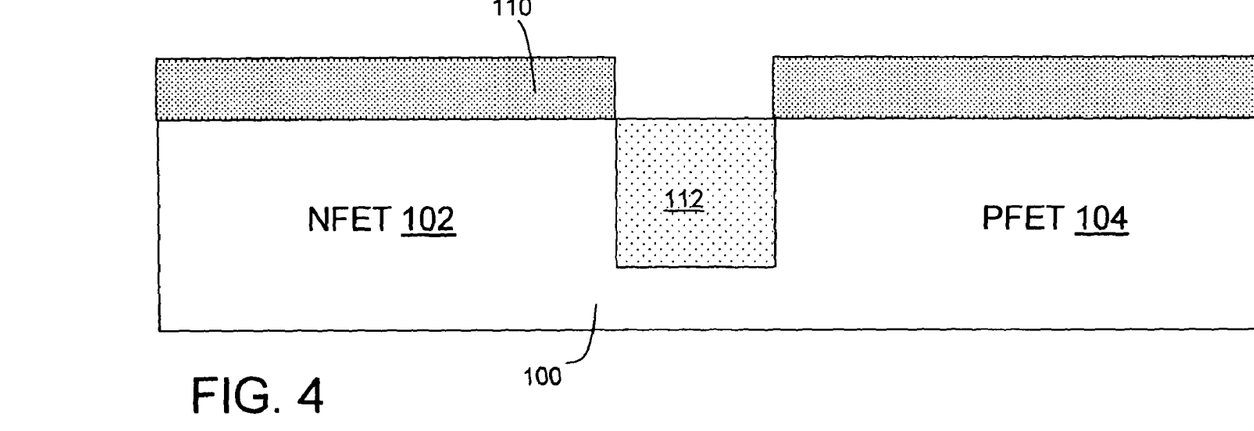

FIGS. 3-4 show an alternative embodiment in which trench isolation 112 is formed in substrate 100 (FIG. 3) prior to performing the single epitaxial growth of SiGe layer 110 over substrate 100 (FIG. 4). As shown in FIG. 4, due to the presence of trench isolation 112, SiGe layer 110 is selectively grown from the remaining exposed substrate 100.

Figures 5, 6:
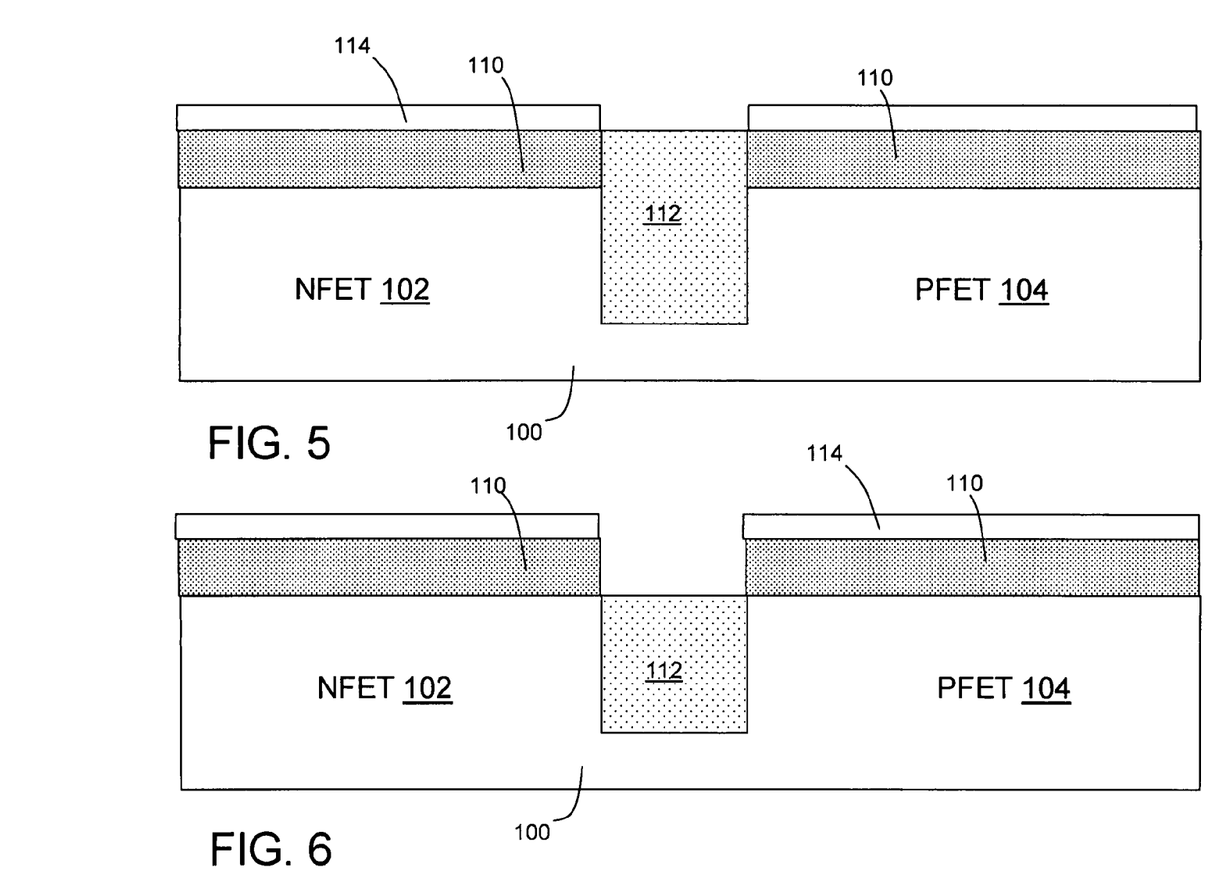

FIGS. 5-6 show an optional process in which a silicon (Si) cap 114 is epitaxially grown over SiGe layer 110, e.g., by turning off the germanium source. FIG. 5 shows Si cap 114 over the FIG. 2 embodiment (with trench isolation 112 formed after SiGe layer deposition) and FIG. 6 shows Si cap 114 over the FIG. 4 embodiment (with trench isolation formed prior to SiGe layer deposition). Si cap 114 may be provided for a number of reasons, but notably to allow formation of a SiGe plug within a channel of an NFET in NFET area 102, as will be described in greater detail herein. In an alternative embodiment, shown in FIG. 7 applied to the FIG. 2 embodiment only, where Si cap 114 is only required over NFET area 102, a mask 116, such as a silicon nitride ($Si_3N_4$) hardmask, may be formed over PFET area 104 such that epitaxial growth of silicon only occurs over NFET area 102.

Figure 7:
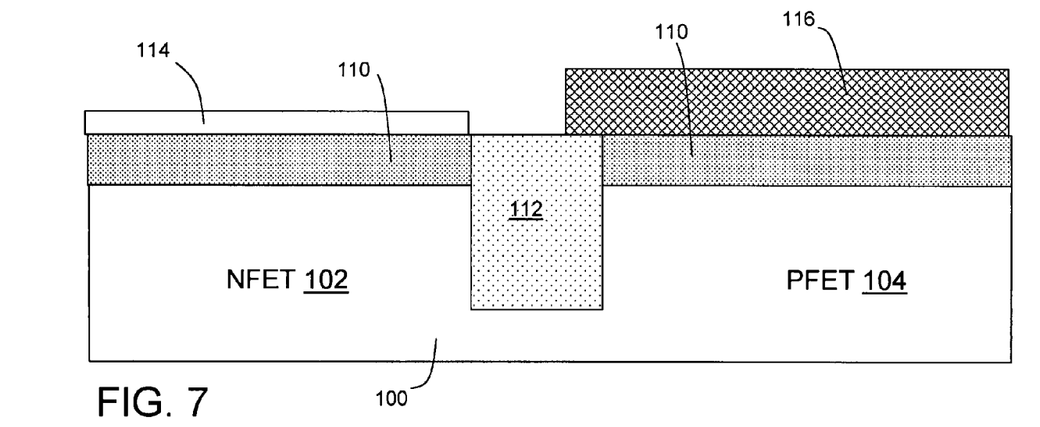

Note, FIGS. 8-16, unless otherwise stated, show subsequent processing based on the FIG. 7 embodiment.

Figure 8:
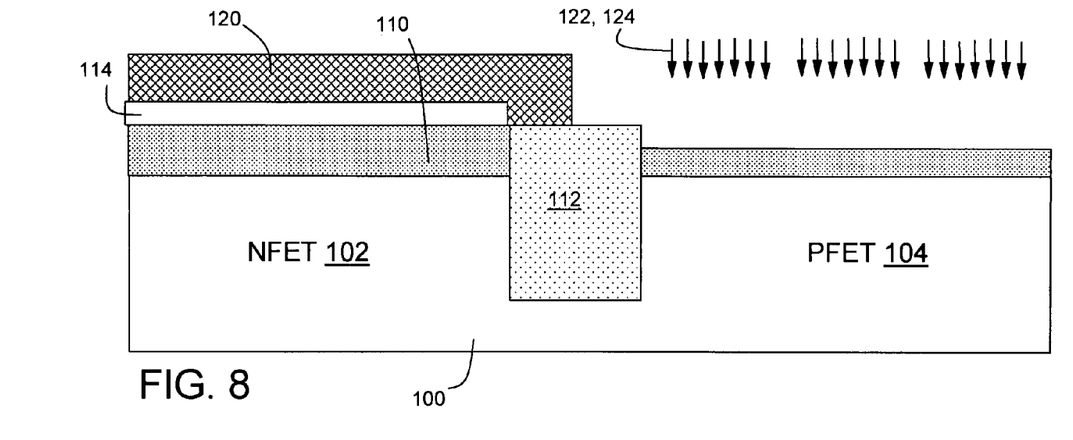
FIG. 8-10 show optional thinning processes according to the disclosure.

FIG. 8 shows an optional process of thinning SiGe layer 110 in PFET area 104. An initial stage of this process includes forming a mask 120 such as a silicon nitride ($Si_3N_4$) hardmask over NFET area 102. Subsequent processing to thin SiGe layer 110 in PFET area 104 may occur in a number of ways. In one embodiment, shown in FIG. 8, the thinning process may include performing a reactive ion etch (RIE) 122 on PFET area 104, resulting in the thinning of SiGe layer 110. In another embodiment, also shown in FIG. 8, the thinning process may include performing a wet etch 124, such as an aqueous mixture of ammonium hydroxide ($NH_4OH$) and hydrogen peroxide ($H_2O_2$), which may also be referred to as "standard clean-1" or "SC-1", resulting in the thinning of SiGe layer 110. Where Si cap 114 is formed over SiGe layer 110 prior to mask 120 forming, e.g., as in FIGS. 5-6, the SC-1 cleaning results in removal of Si cap 114 over PFET area 104.

Figure 9:
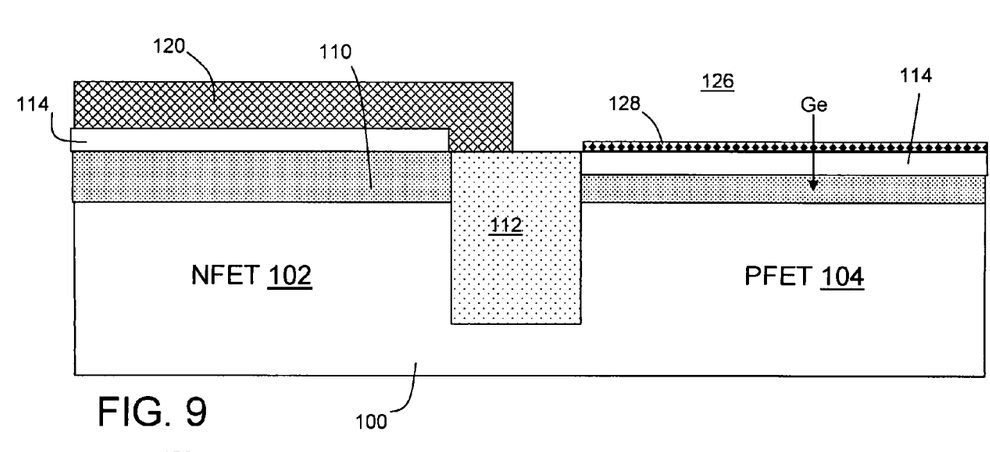
Figure 10:
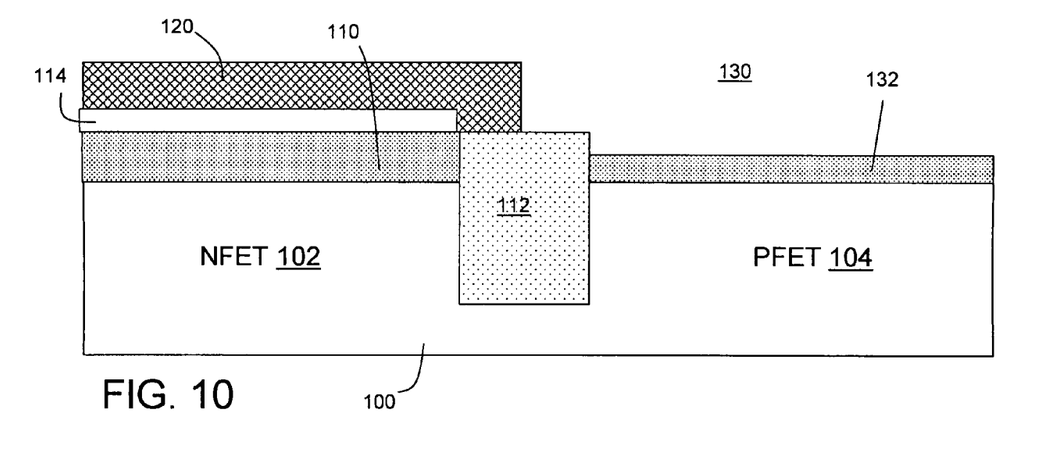

In another embodiment, shown in FIGS. 9-10, the thinning process may include oxidizing PFET area 104, i.e., exposing it to an oxidizing environment 126. This embodiment requires Si cap 114 over PFET area 104, as shown in FIGS. 5-6. This process has the added advantage that it can, independent of NFET area 102, increase a germanium (Ge) concentration in SiGe layer 110 over PFET area 104. In particular, oxidation 126 allows removal of Si cap 114 over PFET area 104 and, since germanium (Ge) resists incorporation into any oxide; the oxidation causes the germanium (Ge) to move further into a SiGe layer 132 over PFET area 104, increasing Ge concentration therein. This movement of germanium (Ge) may be referred to as "snowplowing". Removing oxide 128, e.g., using a hydrofluoric (HF) acid bath 130, after the oxidation results in a thinner and higher Ge concentration SiGe layer 132 over PFET area 104 (compared to SiGe layer 110 over NFET area 102). As will be described in greater detail herein, SiGe layer 132 eventually becomes a channel of a PFET.

Removal of mask 120 from NFET area 102, e.g., by a RIE or wet etch, finalizes any of the above-described thinning processes.

At this stage, if trench isolation 112 and/or Si cap 114 has not already been formed, one or both of them may be formed. That is, in one alternative embodiment to that described above, trench isolation 112 forming occurs after the thinning (FIGS. 8-9). For example, by masking PFET area 104 and epitaxially growing Si cap 114, and/or by performing the above-described trench isolation forming processes.

In another alternative embodiment, an aqueous HF clean followed by a low temp (700° C.-900° C.) in-situ $H_2$ prebake may be performed at this stage (FIGS. 11-16).

Figure 11:
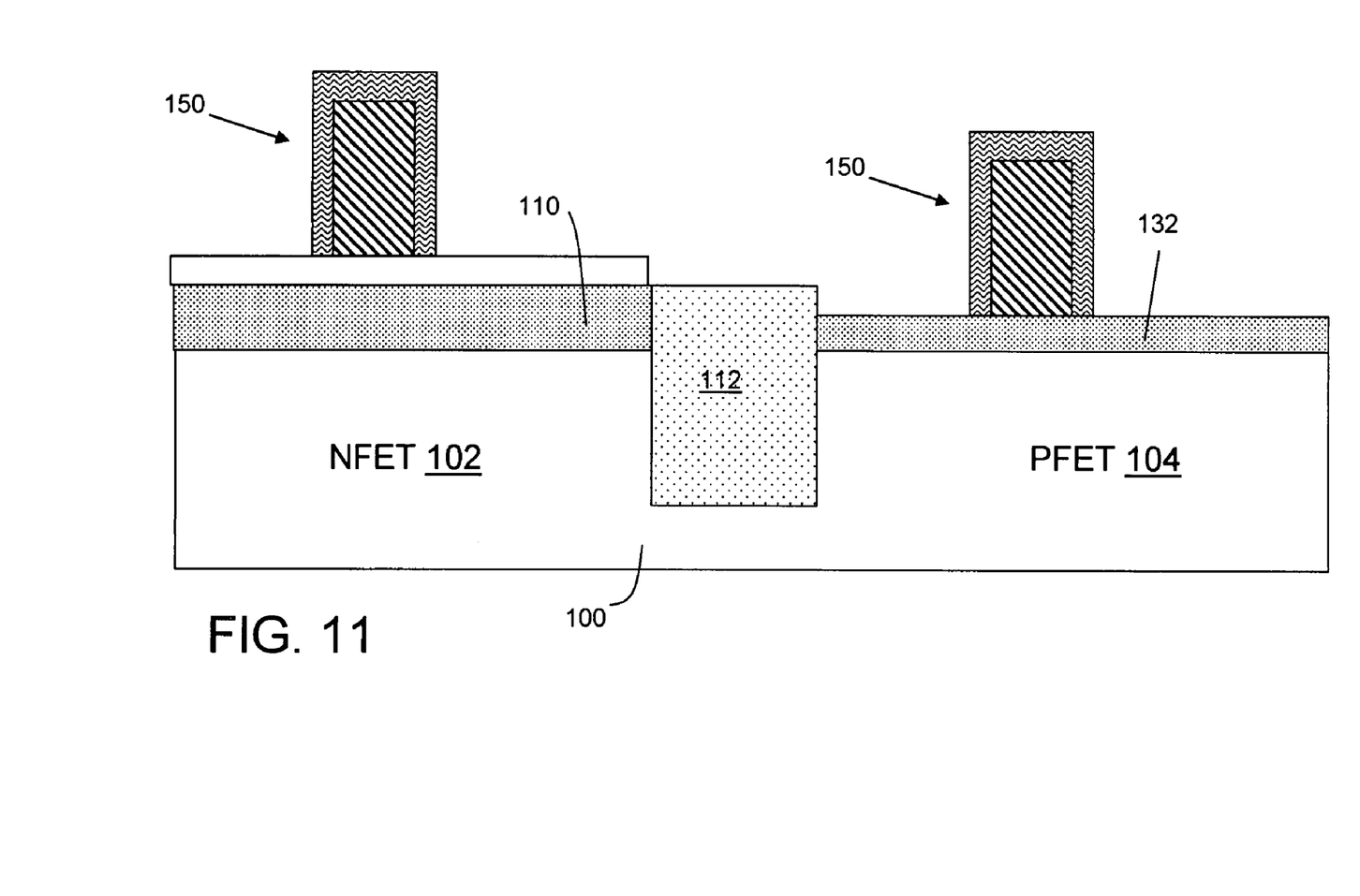
FIGS. 11-16 show processes for forming an NFET and PFET according to the disclosure, with FIG. 16 showing a structure according to the disclosure.
Figure 12:
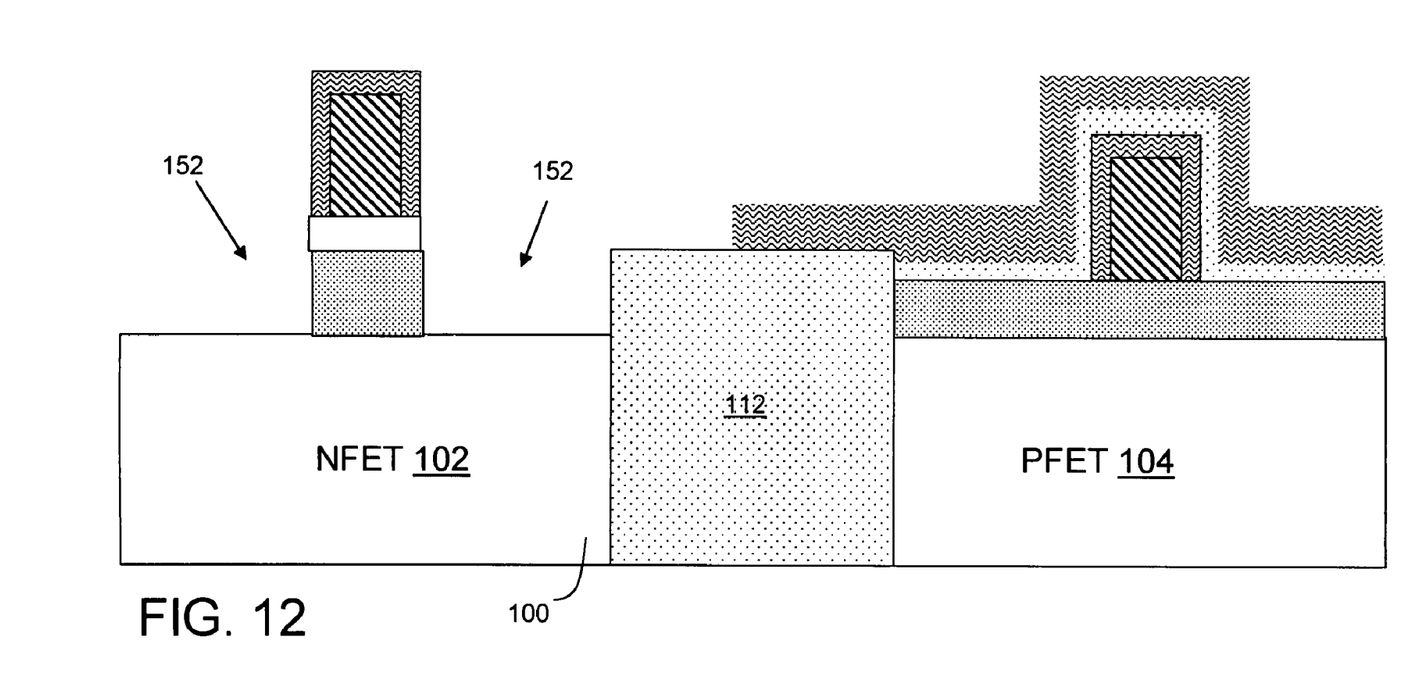
Figure 13:
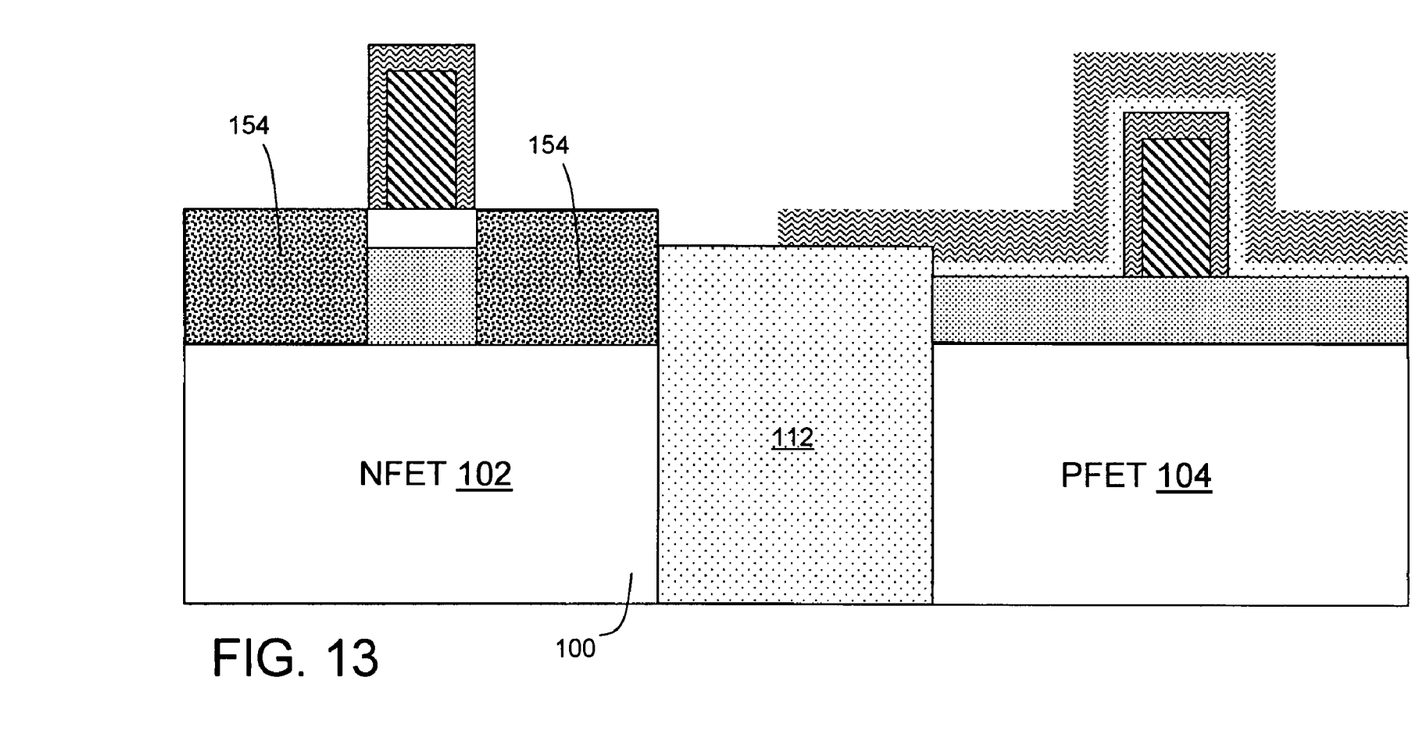
Figure 14:
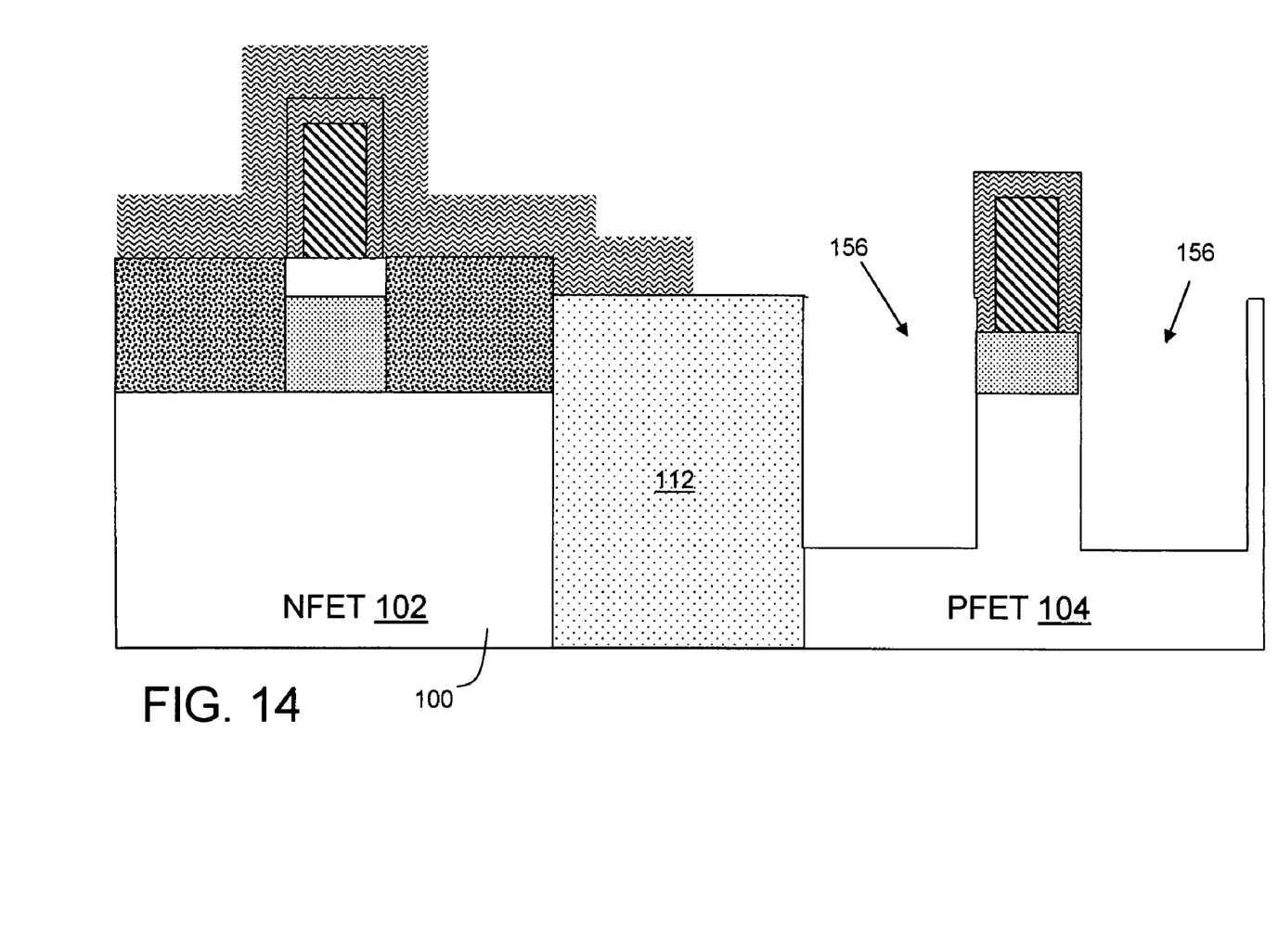
Figure 15:
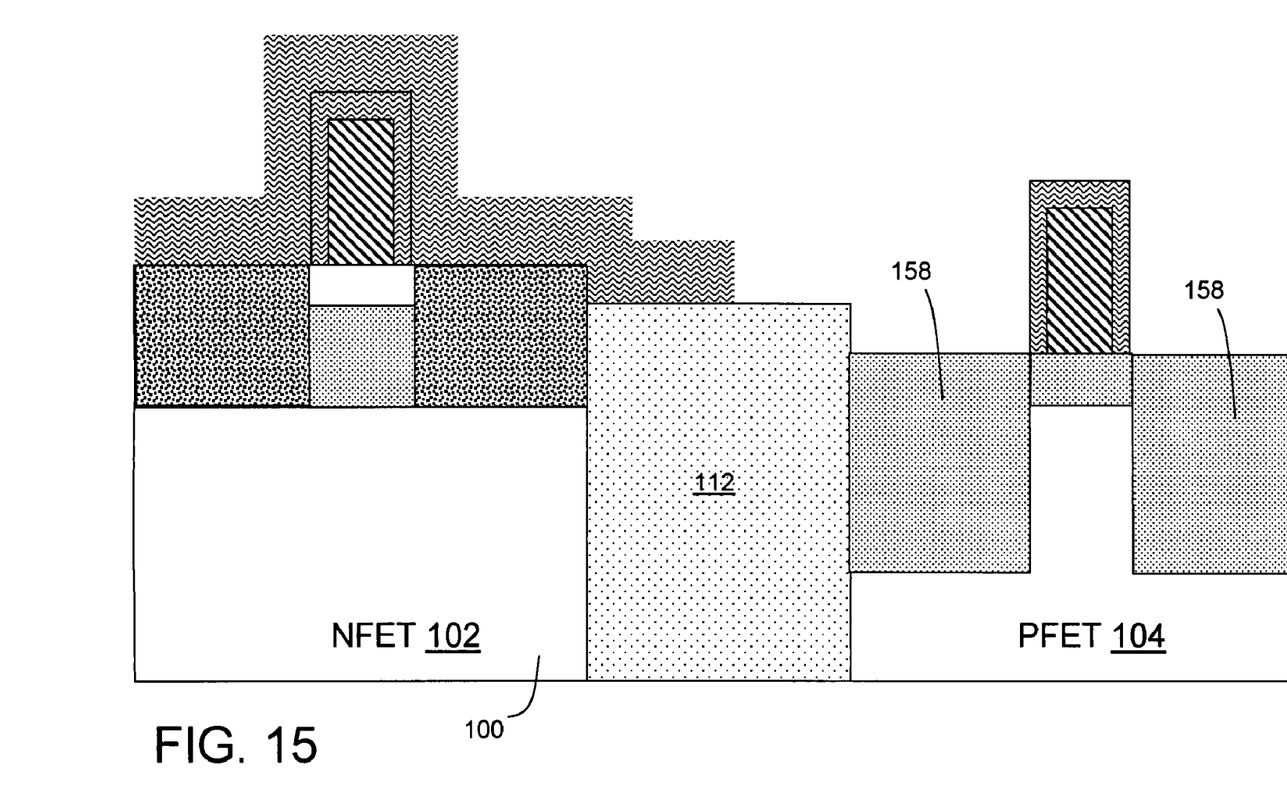
Figure 16:
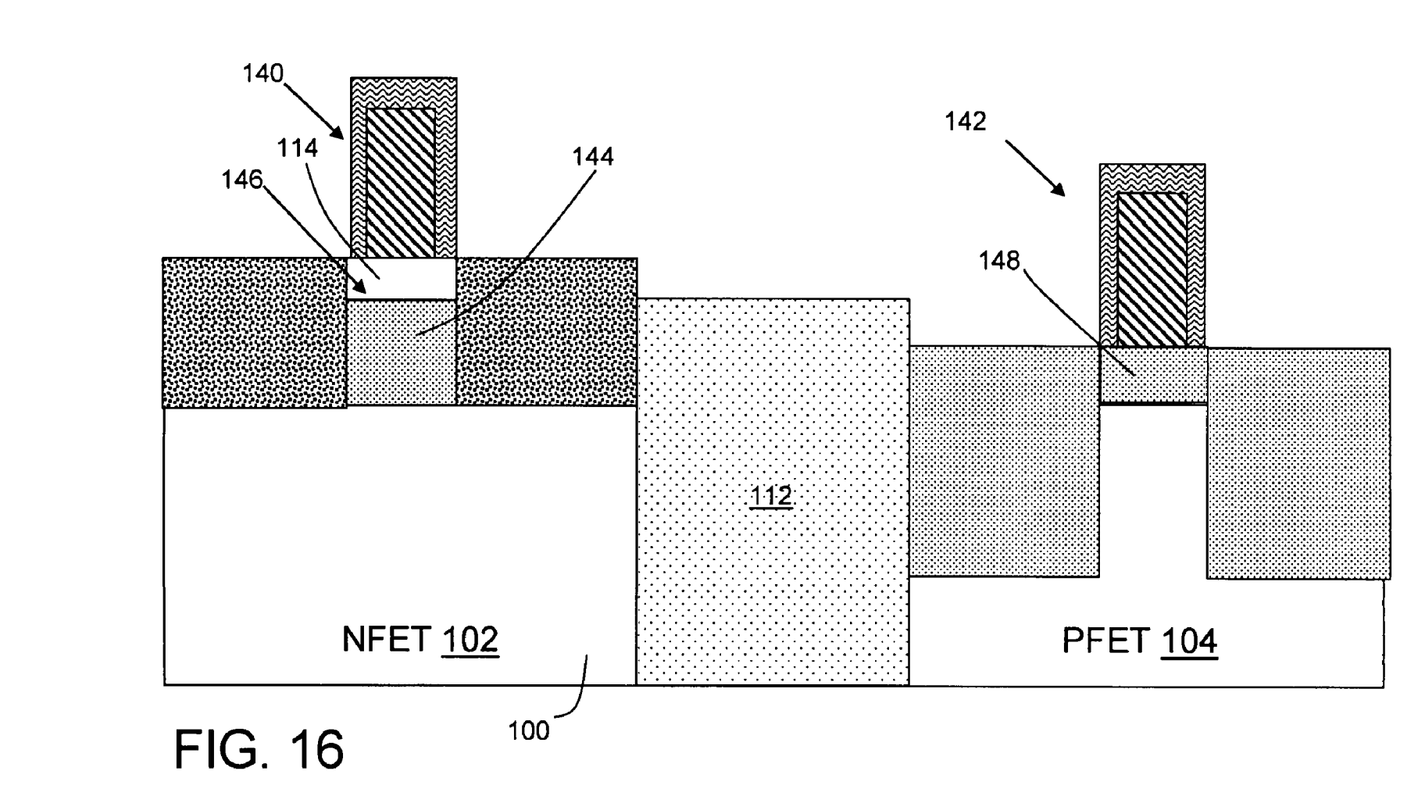

FIGS. 11-16 show forming an NFET 140 (FIG. 16) in NFET area 102 and a PFET 142 (FIG. 16) in PFET area 104. NFET 140 includes a SiGe plug 144 in a channel 146 thereof formed from SiGe layer 110 (FIG. 11) (below Si cap 114), and PFET 142 includes a SiGe channel 148 formed from SiGe layer 132 (FIG. 11). NFET 140 and PFET 142 may be formed using any now known or later developed techniques. FIG. 11 shows forming gates 150, e.g., metal gates including silicon nitride spacer. FIG. 12 shows recessing a source/drain region 152 for NFET area 102, e.g., using a RIE with PFET area 104 masked, and FIG. 13 shows selective silicon (Si) or silicon carbide (SiC) epitaxial growth of source/drain region 154 for NFET area 102. FIG. 14 shows recessing a source/drain region 156 for PFET area 104, e.g., using a RIE with NFET area 102 masked, and FIG. 15 shows selective silicon germanium (SiGe) epitaxial growth of source/drain region 158 for PFET area 104. PFET source/drain 158 SiGe may include an intrinsic compressive strain to enhance performance of PFET 142. FIG. 16 shows NFET 140 and PFET 142. The recessing and epitaxial growth of source/drain regions for NFET 140 and PFET 142 may be reversed in order.

Figure 17:
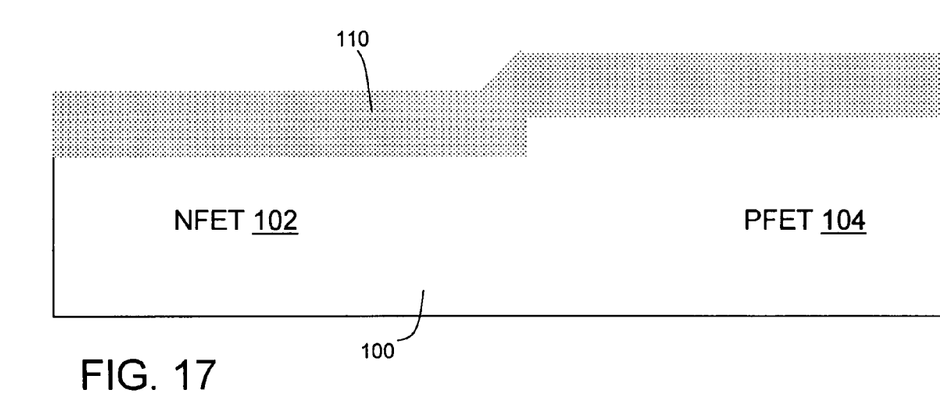
FIGS. 17-18 show an optional process according to the disclosure, with FIG. 18 showing a structure according to the disclosure.
Figure 18:
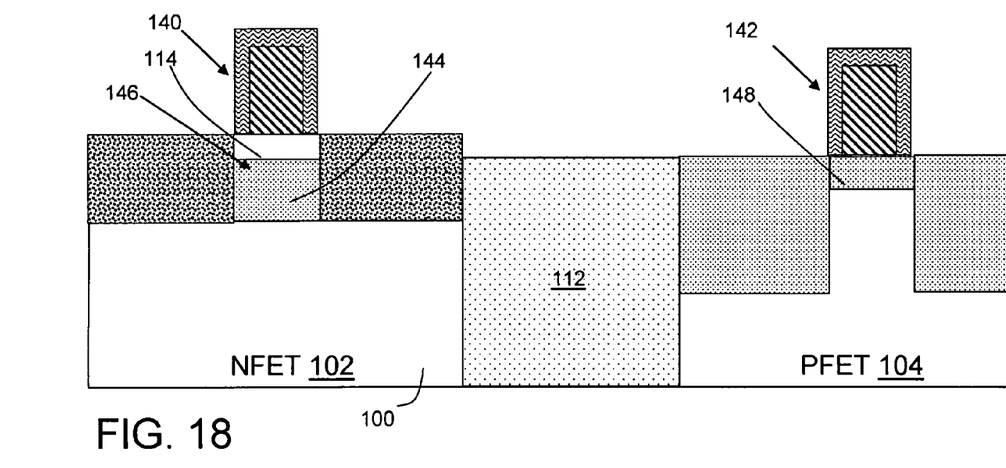

Turning to FIGS. 17-18, in an alternative embodiment, NFET area 102 may be etched prior to performing the epitaxial growth of SiGe layer 110. That is, substrate 100 is etched from the situation shown in FIG. 1 such that NFET area 102 is lower than PFET area 104. In this manner, a step difference between areas 102, 104 that may result in different heights of NFET 140 and PFET 142 (FIG. 16), may be avoided. The step difference may range from approximately 10-20 nm, which may impact planarization in some instances. FIG. 18 shows NFET 140 and PFET 142 after using the FIG. 17 embodiment. NFET 140 and PFET 142 are substantially at the same height.

Referring to FIGS. 16 and 18, a structure according to the disclosure may include NFET 140 having an embedded silicon germanium (SiGe) plug 144 in channel 146 thereof, PFET 142 having SiGe channel 148, and trench isolation 112 between NFET 140 and PFET 142. SiGe channel 148 and SiGe plug 144 are part of a single SiGe layer 110, 132. In contrast to conventional NFETs and PFETs using reverse embedded SiGe plugs and SiGe channels, NFET 140 and PFET 142 are devoid of SiGe epitaxial growth edge effects. More specifically, during multiple selective SiGe epitaxial growth, the facets of the openings into which the growth occurs causes concentrations of silicon and germanium to be different along edges of the sections formed. This situation causes problems such as lost performance, and in the future may prevent morphology correction at advanced technology dimensions. In contrast, since SiGe layer 110 according to the disclosure is formed in a single epitaxial growth, there are no edge effect concerns since the active area and trench isolation 112 boundary is now defined by the active region RIE instead of the epitaxial growth's opening facet. The blanket, single epitaxial layer 110 can be grown with better defectivity and manufacturability (e.g., better uniformity, throughput, lower cost). Consequently, epitaxial opening facet edge effects are eliminated for both NFET 140 and PFET 142.

The methods and related structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
providing a substrate including an NFET area and a PFET area;
etching the NFET area to a point lower than the PFET area;
performing a single epitaxial growth of a silicon germanium (SiGe) layer over the substrate;
thinning the SiGe layer over the PFET area;
forming an NFET in the NFET area, the NFET including a SiGe plug in a channel thereof formed from the SiGe layer, wherein all of the SiGe plug is within the channel; and
forming a PFET in the PFET area, the PFET including a SiGe channel formed from the SiGe layer, wherein all of the SiGe channel is directly below the PFET.

2. The method of claim 1, wherein the thinning includes:
forming a silicon cap over the SiGe layer;
forming a mask over the NFET area;
oxidizing the PFET area, resulting in an increase in a germanium (Ge) concentration in the SiGe layer;
removing the oxide from the PFET area, resulting in the thinning of the SiGe layer; and
removing the mask from the NFET area.

3. The method of claim 1, wherein the thinning includes:
forming a mask over the NFET area;
performing a cleaning, resulting in the thinning of the SiGe layer over the PFET area; and
removing the mask from the NFET area.

4. The method of claim 1, wherein the thinning includes:
forming a mask over the NFET area;
performing a reactive ion etch on the PFET area, resulting in the thinning of the SiGe layer; and
removing the mask from the NFET area.

5. The method of claim 1, further comprising forming a trench isolation between the NFET area and the PFET area after the thinning.

6. The method of claim 1, further comprising forming a trench isolation between the NFET area and the PFET area prior to the epitaxial growth performing, and wherein the epitaxial growth performing is selective.

7. A method comprising:
providing a substrate including an NFET area and a PFET area;
etching the NFET area to a point lower than the PFET area;
performing a single epitaxial growth of a silicon germanium (SiGe) layer over the substrate;
forming an NFET in the NFET area, the NFET including a SiGe plug in a channel thereof formed from the SiGe layer; and
forming a PFET in the PFET area, the PFET including a SiGe channel formed from the SiGe layer;

forming a silicon cap over the SiGe layer;
forming a mask over the NFET area;
oxidizing the PFET area, resulting in an increase in a germanium (Ge) concentration in the SiGe layer;
removing the oxide from the PFET area using a hydrofluoric acid bath, resulting in the thinning of the SiGe layer; and
removing the mask from the NFET area, wherein the removing the mask includes a technique selected from a group consisting of: a reactive ion etch and a wet etch.

8. The method of claim 7, further comprising thinning the SiGe layer in the PFET area, the thinning to be selected from a group consisting of:
performing a cleaning, resulting in the thinning of the SiGe layer over the PFET area, and
performing a reactive ion etch on the PFET area, resulting in the thinning of the SiGe layer.

9. The method of claim 7, further comprising forming a silicon cap over the SiGe layer prior to the mask forming, wherein the cleaning results in removal of the silicon cap over the PFET area.

10. The method of claim 7, further comprising forming a trench isolation between the NFET area and the PFET area.

11. The method of claim 10, wherein the trench isolation forming occurs after the thinning.

12. The method of claim 10, wherein the trench isolation forming occurs prior to the epitaxial growth performing, and the epitaxial growth performing is selective.

13. The method of claim 12, further comprising forming a silicon (Si) cap over the SiGe layer by performing an epitaxial growth of silicon (Si).

14. The method of claim 7, further comprising etching the NFET area prior to the performing of the epitaxial growth of the SiGe layer.

15. The method of claim 7, further comprising performing a single annealing of the substrate and the SiGe layer to remove any residual oxide prior to the NFET and PFET forming.

16. The method of claim 7, wherein the NFET and the PFET forming includes forming:
recessing an NFET source/drain region for the NFET and epitaxial growing silicon or silicon carbide in the NFET source/drain region; and
recessing a PFET source/drain region for the PFET and epitaxially growing silicon germanium (SiGe) in the PFET source/drain region.

* * * * *